(12) United States Patent  
Ishikawa et al.

(10) Patent No.: US 8,664,627 B1  
(45) Date of Patent: Mar. 4, 2014

(54) METHOD FOR SUPPLYING GAS WITH FLOW RATE GRADIENT OVER SUBSTRATE

(75) Inventors: Dai Ishikawa, Ome (JP); Kiyohiro Matsushita, Hachioji (JP)

(73) Assignee: ASM IP Holding B.V., Almere (NL)

( * ) Notice: Subject to any disclaimer, the term of this patent is extended or adjusted under 35 U.S.C. 154(b) by 0 days.

(21) Appl. No.: 13/570,067

(22) Filed: Aug. 8, 2012

(51) Int. Cl.  
   *G21K 5/04* (2006.01)
(52) U.S. Cl.  
   USPC .............. 250/504 R; 250/491.1; 250/492.1
(58) Field of Classification Search  
   USPC ............... 250/492.1, 492.2, 492.21, 492.23, 250/493.1, 504 R, 491.1  
   See application file for complete search history.

(56) References Cited

U.S. PATENT DOCUMENTS

| 6,503,562 B1 | 1/2003 | Saito et al. |
| 2005/0074983 A1 * | 4/2005 | Shinriki et al. ............... 438/785 |
| 2006/0068121 A1 * | 3/2006 | Lee et al. ...................... 427/532 |
| 2007/0298362 A1 * | 12/2007 | Rocha-Alvarez et al. ........ 432/9 |
| 2008/0066778 A1 * | 3/2008 | Matsushita et al. ............ 134/1.2 |

* cited by examiner

*Primary Examiner* — Nicole Ippolito  
(74) *Attorney, Agent, or Firm* — Snell & Wilmer L.L.P.

(57) ABSTRACT

A method for supplying gas over a substrate in a reaction chamber wherein a substrate is placed on a pedestal, includes: supplying a first gas from a first side of the reaction chamber to a second side of the reaction chamber opposite to the first side; and adding a second gas to the first gas from sides of the reaction chamber other than the first side of the reaction chamber so that the second gas travels from sides of the substrate other than the first side in a downstream direction.

20 Claims, 8 Drawing Sheets

METHOD FOR SUPPLYING GAS WITH FLOW RATE GRADIENT OVER SUBSTRATE

BACKGROUND

1. Field of the Invention

The present invention generally relates to semiconductor-processing, particularly to a method for supplying a gas over a substrate with a flow rate gradient in parallel to the substrate, e.g., in a UV irradiation chamber.

2. Description of the Related Art

In film deposition processes or film treatment processes in manufacturing semiconductor devices, reaction gas or purge gas is required to be supplied uniformly over a substrate to be processed in order to process the substrate uniformly with respect to in-plane uniformity. For this purpose, conventionally, by installing a showerhead in an upper part of a reaction chamber facing a substrate, gas is supplied uniformly therefrom toward the substrate. However, in processes such as those where a substrate to be processed is irradiated uniformly with UV light for curing a low-k film formed on the substrate, for example, a showerhead cannot be installed in an upper part of the reaction chamber. In such processes, reaction gas or purge gas is required to be supplied to the reaction chamber from side walls of the reaction chamber. For example, typically two types of gas supply are used. FIG. 1 illustrates one of the types where gas is supplied from a side wall opposite to an exhaust duct inside the reaction chamber, thereby forming laminar flow of the gas over the substrate. FIG. 2 illustrates the other type where gas is supplied from the whole circumference surrounding the outer periphery of the substrate toward the center, and discharged from the circumference of the reaction chamber.

In the former type, because a gas runway over the substrate is long, gradients of substrate temperature and concentration of byproducts are created in a direction from the upstream side to the downstream side, so that uniform processing becomes difficult. In the latter type, since a gas runway over the substrate is short, the substrate temperature can be uniform. However, when gas flow increases, gas flow is centralized at the center, and thus, the substrate temperature near the center may become lower than that of the other parts of the substrate. Further, the centralized gas tends to stagnate at the center, and thus, byproducts or floating particles or foreign objects are not easily discharged and tend to accumulate at the center, causing contamination or creating impurities.

Any discussion of problems and solutions involved in the related art has been included in this disclosure solely for the purposes of providing a context for the present invention, and should not be taken as an admission that any or all of the discussion were known at the time the invention was made.

SUMMARY

Some embodiments provide a method for supplying gas over a substrate in a reaction chamber wherein a substrate is placed on a pedestal, comprising: (i) supplying a first gas from a first side of the reaction chamber to a second side of the reaction chamber opposite to the first side so that the first gas travels, in a main stream from a first side of the substrate to a second side of the substrate opposite to the first side, over the substrate; and (ii) supplying a second gas from sides of the reaction chamber other than the first side of the reaction chamber toward the main stream so that the second gas travels, from sides of the substrate other than the first side in a downstream direction of the main stream, over the substrate. In some embodiments, gas flow in total at the second side of the substrate is greater than gas flow in total at the first side of the substrate. In some embodiments, the first gas for cooling the substrate flows over the substrate from the first side of the substrate to the second side of the substrate opposite to the first side along the main stream, and the second gas for cooling the substrate flows over the substrate from sides other than the first side of the substrate toward the main stream along auxiliary streams so as to join the main stream in a manner such that the temperature gradient of the mixed gas along the direction from the first side to the second side of the substrate can be alleviated, and/or the concentration gradient of byproducts released from the substrate along the direction from the first side to the second side of the substrate can be alleviated. In the main stream without the auxiliary streams, the more mixed gas travels downstream the higher the temperature of the mixed gas becomes, and/or the more mixed gas travels downstream the higher the concentration of byproducts released from the substrate becomes. In some embodiments, by adding the auxiliary streams to the main stream, the temperature of the mixed gas can become substantially or nearly constant along the direction from the first side to the second side of the substrate, and/or the concentration of byproducts released from the substrate can become substantially or nearly constant.

For purposes of summarizing aspects of the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description which follows.

BRIEF DESCRIPTION OF THE DRAWINGS

These and other features of this invention will now be described with reference to the drawings of preferred embodiments which are intended to illustrate and not to limit the invention. The drawings are greatly simplified for illustrative purposes and are not necessarily to scale.

DETAILED DESCRIPTION OF EMBODIMENTS

Figure 1:
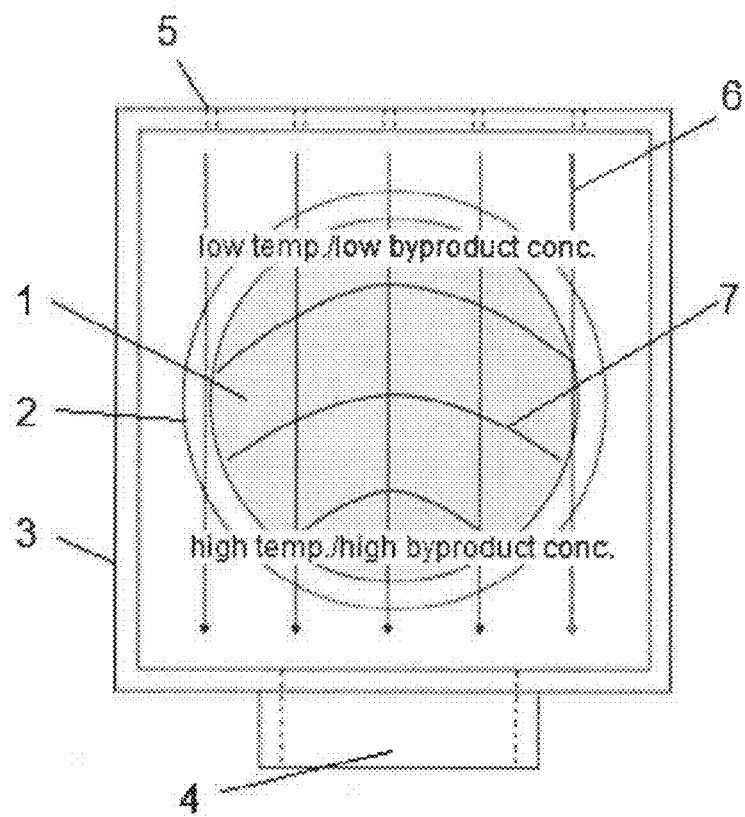
FIG. 1 is a schematic plane view of a conventional semiconductor-processing apparatus wherein a substrate is loaded and a cooling gas flows over the substrate in one direction.

In this disclosure, "gas" may include vaporized solid and/or liquid and may be constituted by a single gas or a mixture of gases. In this disclosure, "a" refers to a species or a genus including multiple species. Further, in this disclosure, any two numbers of a variable can constitute a workable range of the variable as the workable range can be determined based on routine work, and any ranges indicated may include or exclude the endpoints. Additionally, any values of variables indicated may refer to precise values or approximate values and include equivalents, and may refer to average, median, representative, majority, etc. in some embodiments.

In the present disclosure where conditions and/or structures are not specified, the skilled artisan in the art can readily provide such conditions and/or structures, in view of the present disclosure, as a matter of routine experimentation.

In all of the disclosed embodiments, any element used in an embodiment can be replaced with any elements equivalent thereto, including those explicitly, necessarily, or inherently disclosed herein, for the intended purposes. Further, the present invention can equally be applied to apparatuses and methods.

In this disclosure, any defined meanings do not necessarily exclude ordinary and customary meanings in some embodiments.

As described above, in some embodiments, a method for supplying gas over a substrate in a reaction chamber wherein a substrate is placed on a pedestal, comprises; (i) supplying a first gas from a first side of the reaction chamber to a second side of the reaction chamber opposite to the first side so that the first gas travels, in a main stream from a first side of the substrate to a second side of the substrate opposite to the first side, over the substrate; and (ii) supplying a second gas from sides of the reaction chamber other than the first side of the reaction chamber toward the main stream so that the second gas travels, from sides of the substrate other than the first side in a downstream direction of the main stream, over the substrate.

In the present disclosure, "side" may refer to one of two or more contrasted parts or places within an area, identified by its location with respect to a center. For example, sides may generally include an upper side, lower side, left side, and right side with respect to a center as viewed from above, and further, an upper left side, upper right side, lower left side, and lower right side, wherein the upper side may be designated as an upstream side or a first side, and the lower side may be designated as a downstream side or a second side. In the same manner, as many sides as necessary can be defined by substantially equally dividing the interior of the reaction chamber or the substrate as viewed from above. In some embodiments, there are four sides, six sides, or eight sides. The sides can be defined mathematically (e.g., when the inner wall surrounding the pedestal is circular) or by structures of the reaction chamber (e.g., when the inner wall surrounding the pedestal is polygonal such as quadrilateral).

In some embodiments, gas flow in total at the second side of the substrate is greater (e.g., substantially greater such as at least about 1.1 times, about 1.5 times, about 2 times, or about 5 times greater) than gas flow in total at the first side of the substrate. The gas flow which can be defined by volume of gas passing through a given cross section can be determined based on the number and locations of gas nozzles, the conductance of each gas nozzle, the location of an exhaust duct, etc. and based on routine experiments.

In some embodiments, the gas flow has a flow rate gradient along the main stream where the flow rate gradually increases, from the first side of the reaction chamber to the second side of the reaction chamber, over the substrate.

In some embodiments, the second gas is supplied from the sides toward the center of the substrate. For example, it can be accomplished where a circular flange with gas nozzles is installed around the pedestal wherein gas nozzles for the second gas are directed to the center and distributed around the flange except for a section corresponding to the first side of the reaction chamber, and gas nozzles for the first gas are directed to the center and distributed around the section corresponding to the first side. Further, in some embodiments, the first and second gases are discharged from the reaction chamber through a circular duct arranged around the outer periphery of the pedestal. In some embodiments, the second gas is supplied from the sides through gas nozzles toward an axis passing through the first and second sides of the reaction chamber, at angles relative to the axis arranged so as to establish a desired flow rate gradient along the main stream.

In some embodiments, the second gas is supplied from the sides toward an axis passing the first and second sides of the substrate. For example, it can be accomplished where a quadrilateral flange with gas nozzles is installed around the pedestal wherein gas nozzles for the second gas are directed to an axis passing through the first and second sides of the reaction chamber, at a right angle, for example, relative to the axis and distributed around the flange except for a section corresponding to the first side of the reaction chamber, and gas nozzles for the first gas are directed to the second side of the reaction chamber and distributed around the section corresponding to the first side. In some embodiments, the gas nozzles are disposed at angles relative to the axis, which vary (increase or decrease) depending on the distance along the axis from the gas nozzles at the first side, in some embodiments, the first and second gases are discharged from the reaction chamber through a duct disposed in a vicinity of the second side of the reaction chamber.

In some embodiments, the first and second gases are supplied from gas nozzles circularly arranged above and around the outer periphery of the pedestal and directed to the center of the substrate, wherein first gas nozzles supplying the first gas are disposed at the first side of the reaction chamber, and second gas nozzles supplying the second gas are disposed at the sides other than the first side of the reaction chamber. In some embodiments, gas nozzles disposed in the same side collectively have a conductance, and the first gas nozzles have a higher conductance than do the second gas nozzles. When pressure (P) is exerted on gas discharged from a gas nozzles having conductance (C), gas flow (Q) is P·C. Thus, when the pressure exerted on gas nozzles is the same, the gas flow from the gas nozzle having higher conductance is greater than that from the gas nozzle having lower conductance in correlation with the difference in conductance. In some embodiments, the first gas nozzles are disposed at shorter intervals, have a larger diameter, and/or have a shorter nozzle length as compared with those of the second gas nozzles, thereby adjusting/increasing their conductance. In some embodiments, no gas nozzles are disposed at the second side of the reaction chamber. In some embodiments, the conductance of the first gas nozzles is about five times higher than that of the second gas nozzles. The conductance of the gas nozzles refers to the average conductance of the respective gas nozzles in some embodiments, or the average conductance of the gas nozzles per side where the gas nozzles are disposed in other embodiments. In some embodiments, the conductance of the first gas nozzles is at least 1.5 times, 2 times, 4 times, or 10 times greater than that of the second nozzles. In some embodiments, independent of the conductance of the first gas nozzles and the conductance of the second gas nozzles (which can be substantially the same or different), the conductance of an exhaust duct at the second side of the reaction chamber is substantially greater than that of an exhaust duct at the first side of the reaction chamber if any.

In some embodiments, an exhaust port is disposed at the second side of the reaction chamber so that more gas is discharged from the second side of the reaction chamber than from the other sides of the reaction chamber, contributing to formation of the main stream.

In some embodiments, the first gas and the second gas are the same gas and supplied through the first and second gas nozzles via a common gas channel circularly disposed above and around the outer periphery of the pedestal. In the above, the gas flow rate of each gas nozzle is determinable by its conductance since the gas pressure in the common gas channel is constant. Alternatively, in other embodiments, the first gas and the second gas are supplied via different lines, and they can be different gases or the same gas. Typically, the first and second gases are cooling gas or purge gas such as rare gas (e.g., Ar, He), N2, H2, or the like, but they are not limited thereto and can be reactant gas such as N2, O2, and CO2, and precursor such as Si-containing gas. In some embodiments, the total flow rate of first and second gases supplied into the reaction chamber is about 1 slm to about 20 slm (typically about 2 slm to about 8 slm), and the temperature of the gases is about 0° C. to about 300° C. (typically about 100° C. to about 200° C. In some embodiments, the flow rate of the gas is more than 4 slm, since when the flow rate is high, the uniformity of temperature and/or byproduct concentration over a substrate tends to degrade according to a conventional gas supply system, but according to the disclosed embodiments, the uniformity of these does not significantly degrade.

In some embodiments, the method for supplying gas further comprises rotating the pedestal while supplying the first and second gases, thereby rendering more uniform the temperature of the substrate and/or the concentration of byproducts over the substrate. Alternatively, in other embodiments, the pedestal is not rotatable. In some embodiments, while supplying the first and second gases as a cooling gas, the substrate is irradiated with UV light, or alternatively, by supplying the first and second gases as a purge gas, the reaction chamber is purged after introducing a reactant gas or precursor gas in thermal or plasma CVD or ALD or the like (independent of the presence of a showerhead). Further, the disclosed gas supply system can also be applied to an annealing process. Supplying the first and second gases can be applied to any suitable processing where some properties of the gases change as they travel over a substrate, e.g., the temperature of a cooling gas changes as it travels over a substrate, or the concentration of byproducts or unwanted substances contained in a gas changes as the gas travels over a substrate.

In some embodiments, the present invention provides a UV irradiation apparatus comprising; (a) a reaction chamber; (b) a pedestal disposed inside the reaction chamber, for loading a substrate thereon; (c) a UV irradiation unit disposed above the reaction chamber; and (d) a circular flange disposed between the reaction chamber and the UV irradiation unit, said circular flange being provided with a UV transmission window disposed above the pedestal and gas nozzles, wherein the gas nozzles are directed to a center of a substrate when loaded and which nozzles comprise first gas nozzles for supplying a first gas disposed at a first side of the flange and second gas nozzles for supplying a second gas disposed at sides other than the first side of the flange so that the first gas travels, in a main stream from a first side of the substrate to a second side of the substrate opposite to the first side, over the substrate, and the second gas travels, from sides of the substrate other than the first side in a downstream direction of the main stream, over the substrate, wherein the first gas nozzles have higher conductance than do the second gas nozzles.

In some embodiments, the first gas nozzles are disposed at shorter intervals, have a larger diameter, and/or have a shorter nozzle length as compared with those of the second gas nozzles. In some embodiments, no gas nozzles are disposed at the second side of the reaction chamber, and an exhaust port is disposed at the second side of the reaction chamber. In some embodiments, the conductance of the first gas nozzles is 1.5 to 10 (e.g., 3 to 7) times higher than that of the second gas nozzles. In some embodiments, the pedestal is rotatable. Further, any of the embodiments disclosed in relation to the method for supplying gas can be applied to the apparatus disclosed herein.

The embodiments will be explained with respect to drawings which are not intended to limit the present invention.

/FIG. 1 is a schematic plane view of a conventional semiconductor-processing apparatus wherein a substrate is loaded and a cooling gas flows over the substrate in one direction. In FIG. 1, the gas is supplied through gas nozzles 5 which are disposed solely on an upstream side of a reaction chamber 3 and directed to a downstream side of the reaction chamber 3. The gas flows in one direction from the upstream side to the downstream side and is discharged from the reaction chamber through an exhaust duct 4, forming a main stream 6 which is a laminar flow. A substrate 1 is placed on a pedestal 2 and cooled by the gas flowing over the substrate 1. The gas also removes byproducts present on the substrate while traveling over the substrate. The temperature of the substrate 1 and the concentration of byproducts over the substrate at the upstream side of the substrate are typically the lowest, and they increase toward the downstream side of the substrate because the temperature of the gas and the concentration of byproducts transferred in the gas increase as the gas travels over the substrate from the upstream side of the substrate to the downstream side of the substrate, thereby forming non-uniform distributions of temperature and concentration of byproducts as shown by contour lines 7.

Figure 7:
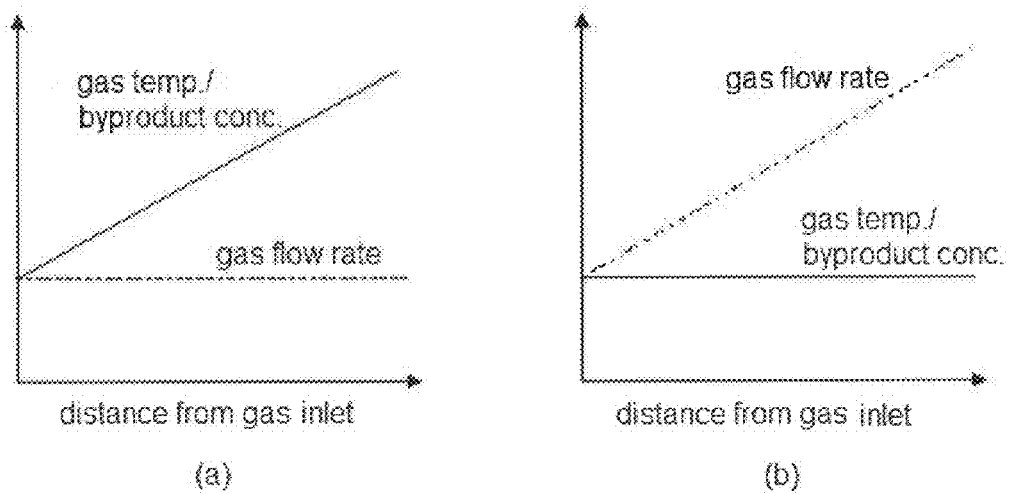
FIG. 7 consists of two graphs (a) and (b), and (a) illustrates the general relationship between the gas temperature/byproduct concentration and the distance from a gas inlet of a main stream according to a conventional gas supply system, and (b) illustrates the general relationship between the gas temperature/byproduct concentration and the distance from a gas inlet of a main stream according to an embodiment of the present invention, provided that the gas inlet is disposed at the upstream edge of a substrate.

The general relationship between the gas temperature/byproduct concentration and the distance from the upstream edge of the substrate toward the downstream edge of the substrate according to the conventional gas supply system may be the one illustrated in (a) in FIG. 7. The gas flow is constant from the upstream side of the reaction chamber to the downstream side of the reaction chamber, whereas the gas temperature and the concentration of byproducts in the gas increase as the gas travels from the upstream side of the reaction chamber to the downstream side of the reaction chamber.

Figure 6:
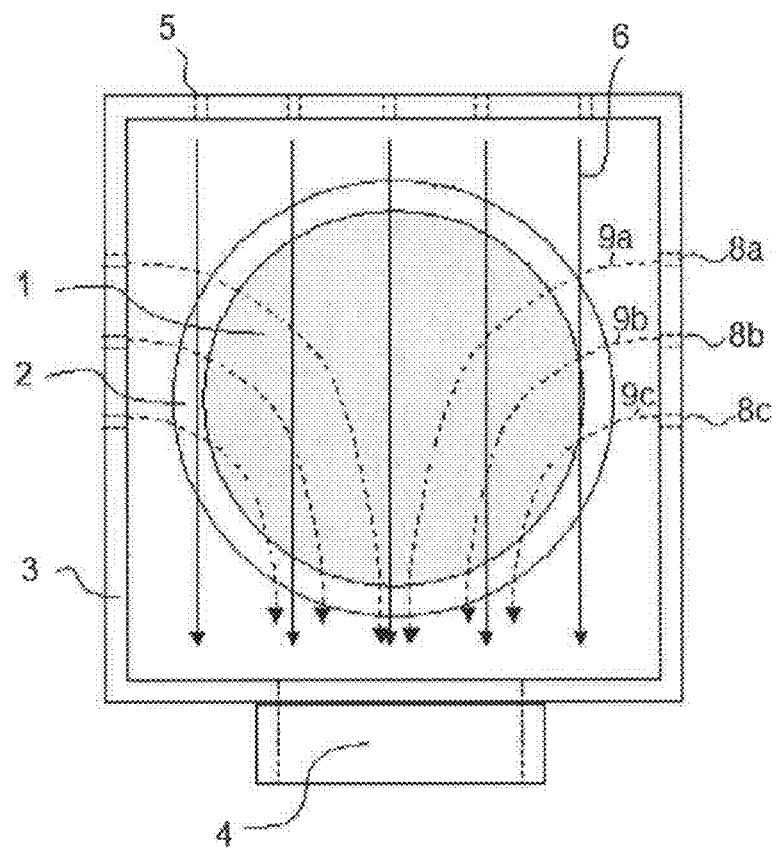
FIG. 6 is a schematic plane view of a semiconductor-processing apparatus wherein a substrate is loaded and a cooling gas flows over the substrate in a main stream and auxiliary streams according to an embodiment of the present invention.

FIG. 6 is a schematic plane view of a semiconductor-processing apparatus wherein a substrate is loaded and a cooling gas flows over the substrate in a main stream and auxiliary streams according to an embodiment of the present invention. In this apparatus, the main stream 6 may be formed in a manner substantially similar to that in the apparatus illustrated in FIG. 1. Further in this apparatus, a second gas is supplied to the reaction chamber 3 through second gas nozzles 8a, 8b, 8c disposed symmetrically on sides between the upstream side and the downstream side of the reaction chamber 3. The second gas nozzles 8a, 8b, 8c are directed to the main stream 6 at a right angle relative to an axis passing through the upstream side and the downstream side of the reaction chamber 3, creating auxiliary streams 9a, 9b, 9c added to the main stream 6. The second gas nozzles are disposed where the auxiliary streams from the second gas nozzles travel over the substrate, typically in an upper half of the side walls of the reaction chamber as illustrated in FIG. 6. In FIG. 6, the main stream 6 is established by setting the conductance of the first gas nozzles 5 in total higher than that of the second gas nozzles 8a, 8b, 8c in total, and disposing the exhaust duct 4 at the downstream side of the reaction chamber only.

The conductance of the first gas nozzles can be set higher than that of the second gas nozzles by increasing the conductance of each first gas nozzle and/or increasing the number of the first gas nozzles as compared with those of the second gas nozzles. When the first and second gas nozzles are connected to different gas lines, by increasing the gas pressure of the first gas, the main stream can also be established. In some embodiments, the number of the first gas nozzles is one to ten (typically two to eight), and the number of the second gas nozzles per side is one to eight (typically two to six), and typically the number of the first gas nozzles is greater than that of the second gas nozzles. In some embodiments, the conductance of each first gas nozzle is the same or different, and the conductance of each second gas nozzle is the same or different, and further, the conductance of the first gas nozzles is greater than that of the second gas nozzles. In some embodiments, the second gas nozzles are directed toward the axis passing through the upstream side and the downstream side of the reaction chamber, approximately at a right angle or other angles such as acute angles relative to the axis. The angle of each second gas nozzle may be the same or different so that the auxiliary streams can effectively be formed over the substrate. In some embodiments, the inner diameter of the first gas nozzles is about 0.5 mm to about 8 mm (typically about 1 mm to about 3 mm), whereas the inner diameter of the second gas nozzles is about 0.5 mm to about 5 mm (typically about 1 mm to about 3 mm). In some embodiments, the length of the first gas nozzles is about 1 mm to about 50 mm (typically about 5 mm to about 30 mm), whereas the length of the second gas nozzles is about 1 mm to about 80 mm (typically about 5 mm to about 40 mm).

The auxiliary streams are created so that a gas flow rate gradient is established as illustrated in (b) in FIG. 7 which shows the general relationship between the gas temperature/byproduct concentration and the distance from the upstream edge of the substrate toward the downstream edge of the substrate according to the gas supply system illustrated in FIG. 6. The gas flow rate gradually increases from the upstream side toward the downstream side of the reaction chamber. In general, the more gas traveling toward the downstream side of the reaction chamber, the higher the temperature of the travelling gas becomes, and the higher the concentration of byproducts included in the travelling gas becomes as illustrated in (a) in FIG. 7. However, by increasing the volume of the gas travelling toward the downstream side of the reaction chamber, it is possible to compensate for the increases of the temperature and the byproduct concentration of the gas. As a result, desirably, the temperature and the byproduct concentration of the gas can be constant from the upstream side of the reaction chamber to the downstream side of the reaction chamber as illustrated in (b) in FIG. 7.

Figure 2:
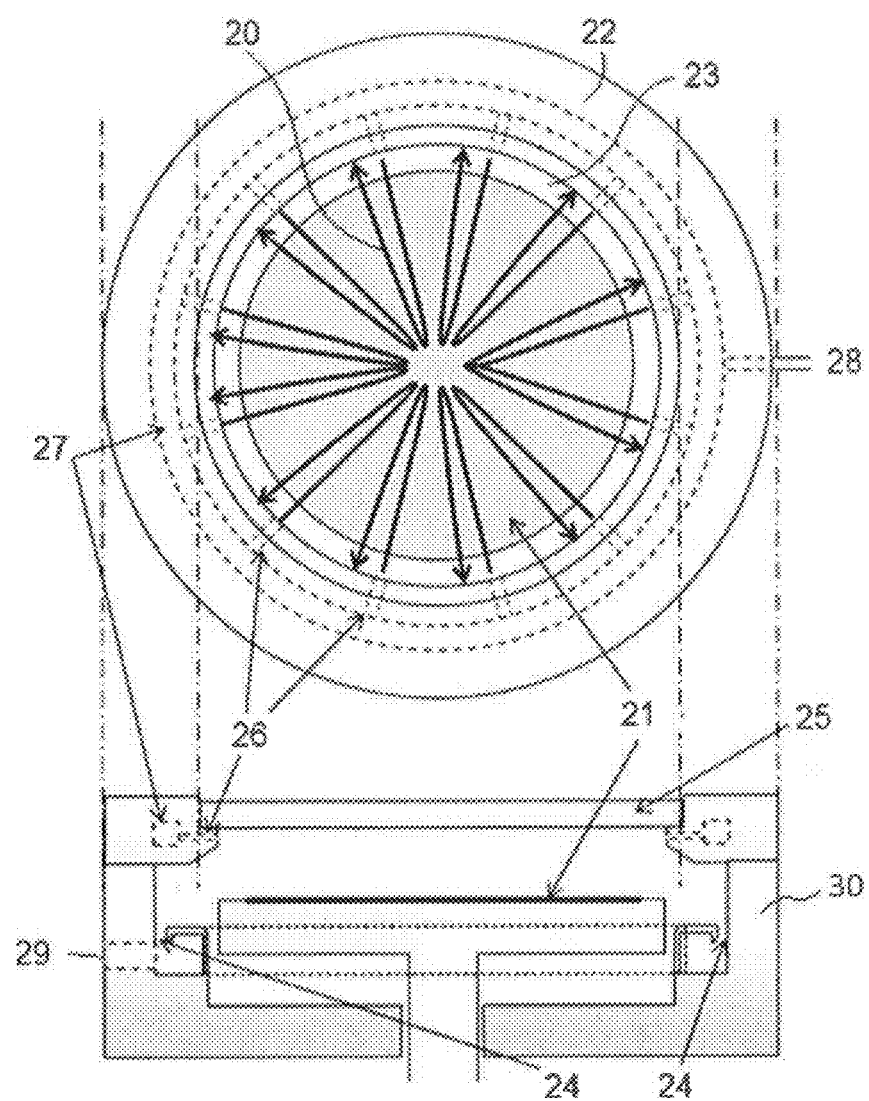
FIG. 2 is a schematic plane view with a schematic cross sectional view of a conventional semiconductor-processing apparatus wherein a substrate is loaded and a cooling gas flows in and out over the substrate in radial directions.
Figure 3:
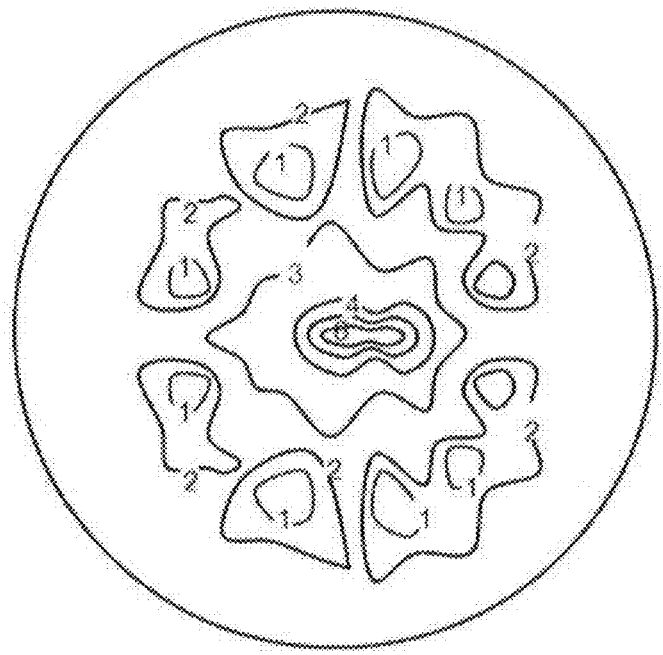
FIG. 3 is an illustrated distribution map showing concentrations of byproducts over a substrate according to a conventional gas supply system illustrated in FIG. 2.

FIG. 2 is a schematic plane view with a schematic cross sectional view of another conventional semiconductor-processing apparatus wherein a substrate is loaded and a cooling gas flows in and out over the substrate in radial directions. A gas is first supplied via a gas line 28 to a circular gas channel 27 formed in a flange 22 and then supplied to a reaction chamber 30 through gas nozzles 26 toward the center of the reaction chamber 30 where a substrate 21 is placed on a pedestal 23. The substrate 21 is irradiated with UV light through a transmission window 25 installed in the flange 22 while the gas is supplied over the substrate 21. The gas travels from the gas nozzles 26 toward the center and then returns toward the outer periphery of the pedestal 22 after reaching near the center as indicated by arrows 20, and then the gas is discharged from the reaction chamber 30 through a circular gap 24 of a duct and an exhaust port 29. In this apparatus, since a gas runway over the substrate is short, the substrate temperature can be uniform. However, when gas flow increases, gas flow is centralized at the center, and thus, the substrate temperature near the center may become lower than that of the other parts of the substrate. Further, the centralized gas tends to stagnate at the center, and thus, byproducts or floating particles or foreign objects are not easily discharged and tend to accumulate at the center. FIG. 3 is an illustrated distribution map showing concentrations of byproducts over a substrate according to the conventional gas supply system illustrated in FIG. 2. The distribution of byproducts over the substrate illustrated in FIG. 3 is obtained using a flow simulation analysis assuming molecular flow and the concentrations of byproducts are indicated by contour lines 1 to 6 where 6 is the highest and 1 is the lowest in a scale of 1 to 6. As can be seen from FIG. 3, the concentration of byproducts is very high (level 6) near the center, and is very low (level 1) near turnaround points of the gas stream.

Figure 5:
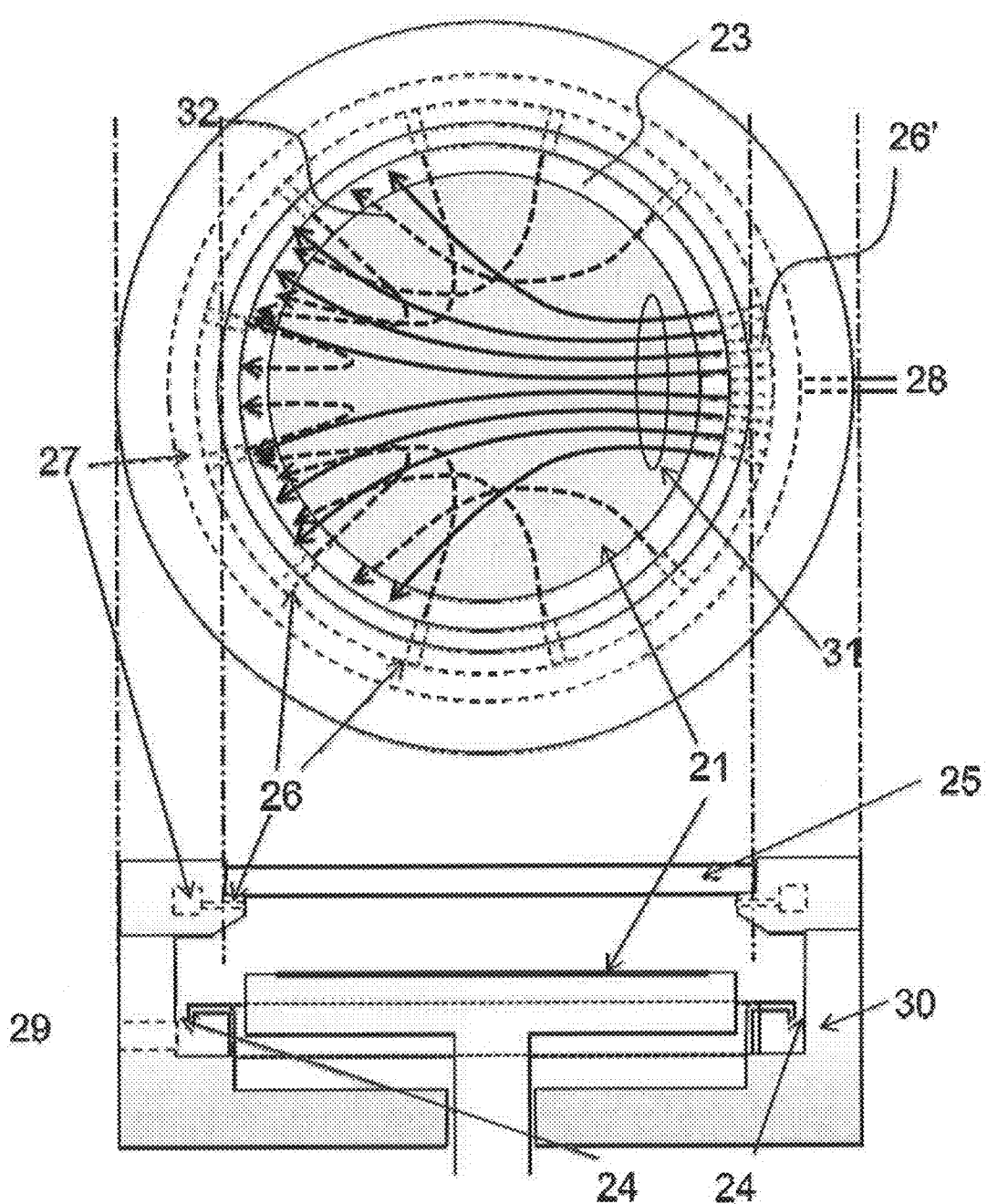
FIG. 5 is a schematic plane view with a schematic cross sectional view of a semiconductor-processing apparatus wherein a substrate is loaded and a cooling gas flows over the substrate in a main stream and auxiliary streams according to an embodiment of the present invention.

FIG. 5 is a schematic plane view with a schematic cross sectional view of a semiconductor-processing apparatus wherein a substrate is loaded and a cooling gas flows over the substrate in a main stream and auxiliary streams according to an embodiment of the present invention. A gas is first supplied via a gas line 28 to a circular gas channel 27 formed in a flange 22 and then supplied to a reaction chamber 30 through gas nozzles 26, 26' toward the center of the reaction chamber 30 where a substrate 21 is placed on a pedestal 23. The substrate 21 is irradiated with UV light through a transmission window 25 installed in the flange 22 while the gas is supplied over the substrate 21. In this apparatus, the gas nozzles 26 are disposed differently from those illustrated in FIG. 2 so that two predominant gas streams are formed, a main stream 31 and auxiliary streams 32. For the main stream 31, the gas nozzles 26' are disposed dose to each other, i.e., at significantly short intervals at the upstream side of the reaction chamber which is opposite to the downstream side of the reaction chamber where an exhaust port 29 is located. The first gas travels from the gas nozzles 26' toward the center and gradually spreads outwardly toward the outer periphery of the pedestal 22 as indicated by arrows 31, and then the first gas is discharged from the reaction chamber 30 through a circular gap 24 of a duct and the exhaust port 29. Since the gas nozzles 26' are closely disposed as compared with other gas nozzles 26 for the auxiliary streams 32, the conductance of the gas nozzles 26' per area is significantly higher (here about five times higher) than the conductance of the other gas nozzles 26 per area, and thus, the main stream 31 does not flow backward but passes through the downstream side of the reaction chamber.

Figure 4:
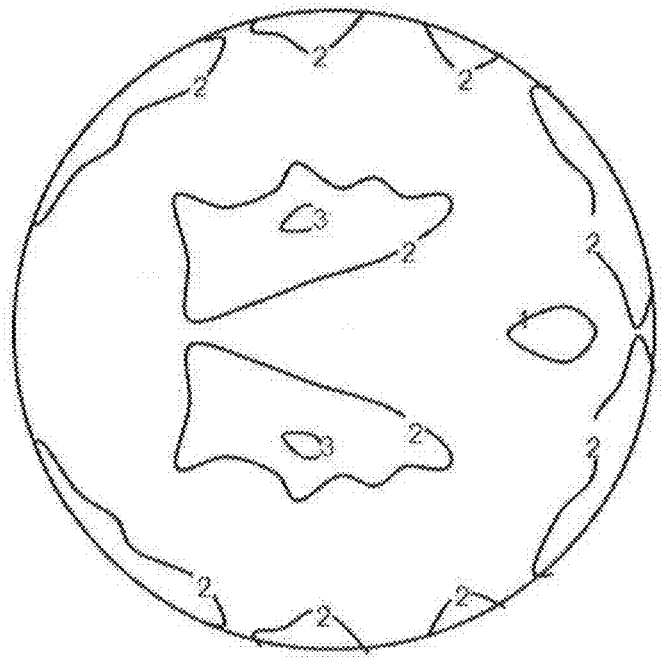
FIG. 4 is an illustrated distribution map showing concentrations of byproducts over a substrate according to an embodiment of the present invention.

The conductance of the gas nozzles 26' can also become higher than that of the gas nozzles 26 by increasing the conductance of each gas nozzle 26' and/or increasing the number of the gas nozzles 26' per area. For the auxiliary streams 32, the gas nozzles 26 are disposed at given intervals symmetrically. The second gas travels from the gas nozzles 26 toward the center and then partially flows backward while shifting the current downstream due to the main stream 31 (and partially join the main stream 31) toward the outer periphery of the pedestal 22 as indicated by arrows 32 (the return point at the periphery of the pedestal is shifted downstream of the supply point at the periphery of the pedestal) because the auxiliary streams 32 are weaker than the main stream 31, and then the second gas is discharged together with the first gas from the reaction chamber 30 through the circular gap 24 and the exhaust port 29.

in this apparatus, since the auxiliary streams of the second gas are added to the main stream of the first gas as the first gas travels from the upstream side of the reaction chamber to the downstream side of the reaction chamber, stagnation of gas flow near the center can effectively be inhibited, and flow intensity at the turnaround points can be moderated, thereby improving the distribution of byproducts and also the in-plane temperature distribution. FIG. 4 is an illustrated distribution map showing concentrations of byproducts over a substrate according to the gas supply system illustrated in FIG. 5. The distribution of byproducts over the substrate illustrated in FIG. 4 is obtained using flow simulation analysis as with FIG. 3. The concentrations of byproducts are indicated by contour lines 1 to 3 where 6 is the highest and 1 is the lowest in a scale of 1 to 6. As can be seen from FIG. 4, the concentration of byproducts is much more uniformly distributed than that in FIG. 3. Most parts of the substrate show level 2 or level 3, and there is one spot showing level 1 where the main streams are slightly converged.

Figures 8, 9:
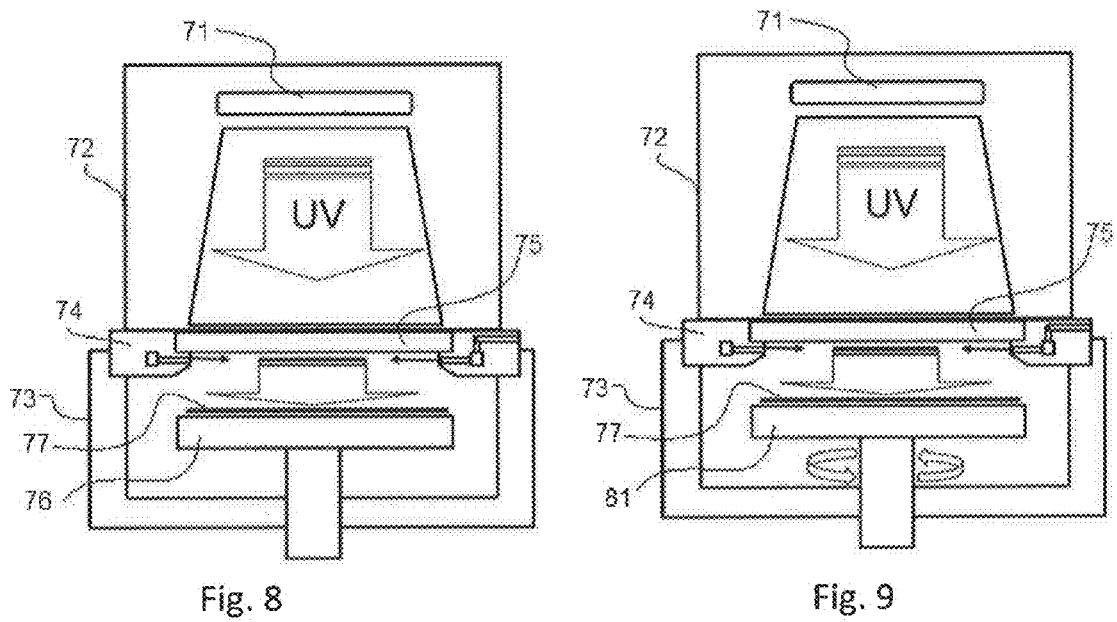
FIG. 8 is a schematic view of a UV irradiation apparatus provided with a gas supply flange according to an embodiment of the present invention.
FIG. 9 is a schematic view of a UV irradiation apparatus provided with a gas supply flange and a rotatable pedestal according to an embodiment of the present invention.

The disclosed gas supply system can be applied to any suitable apparatus, for example, a UV irradiation apparatus, where a cooling gas is supplied according to any of the disclosed embodiments. FIG. 8 is a schematic view of a UV irradiation apparatus provided with a gas supply flange according to an embodiment of the present invention. As shown in FIG. 8, the UV irradiation apparatus used in this example comprises a UV lamp unit 72, UV lamp 71, UV irradiation window 75, vacuum reactor 73, heater table 76 (pedestal), and circular flange 74 with gas nozzles (an exhaust port is omitted). The UV lamp unit 72 may have UV mirrors for efficient irradiation of UV light. A substrate 77 is placed on the heater table 76 and irradiated with UV light while a cooling gas is supplied from the flange according to any of the disclosed embodiments. The flange may be made of the same material as the chamber, such as Al, and a circular gas channel and gas nozzles can be formed in the flange by any suitable methods including conventional excavation of a Al material.

Note that the present invention is not at all limited to the apparatus shown in this figure and any other apparatus can be used so long as it can irradiate UV light. The apparatus shown comprises a chamber that can be controlled to pressures from vacuum to around atmospheric pressure.

FIG. 9 is a schematic view of a UV irradiation apparatus provided with a rotatable heater table (pedestal) 81 according to an embodiment of the present invention. In this apparatus, by rotating the substrate while supplying a cooling gas to the reactor, the temperature and/or the byproduct concentration of the gas can further be improved. In some embodiments, the rotation speed is about 1 rpm to about 100 rpm (typically about 10 rpm to about 20 rpm).

EXAMPLES

The following experiment was conducted using the apparatus illustrated in FIG. 8 with the gas supply system illustrated in FIG. 2 as comparative examples.

1) A Si wafer (300 mm in diameter) on which thermocouples for temperature measurement were attached was manually loaded to the reactor. The heater table temperature was 385° C.

2) Next, inactive gas (Ar and He mixture) was supplied continuously to the reactor (at flow rates shown in FIG. 10) at a pressure of 8 Torr. The temperature of the gas was 165° C.

3) During step (2), UV light with a wavelength of 200 DM or more (type of UV lamp: high-pressure mercury lamp) was irradiated (irradiation power: 125 mW/cm$^2$) onto the Si wafer for a specified period (120 seconds) via the UV irradiation glass (made of quartz).

Figure 10:
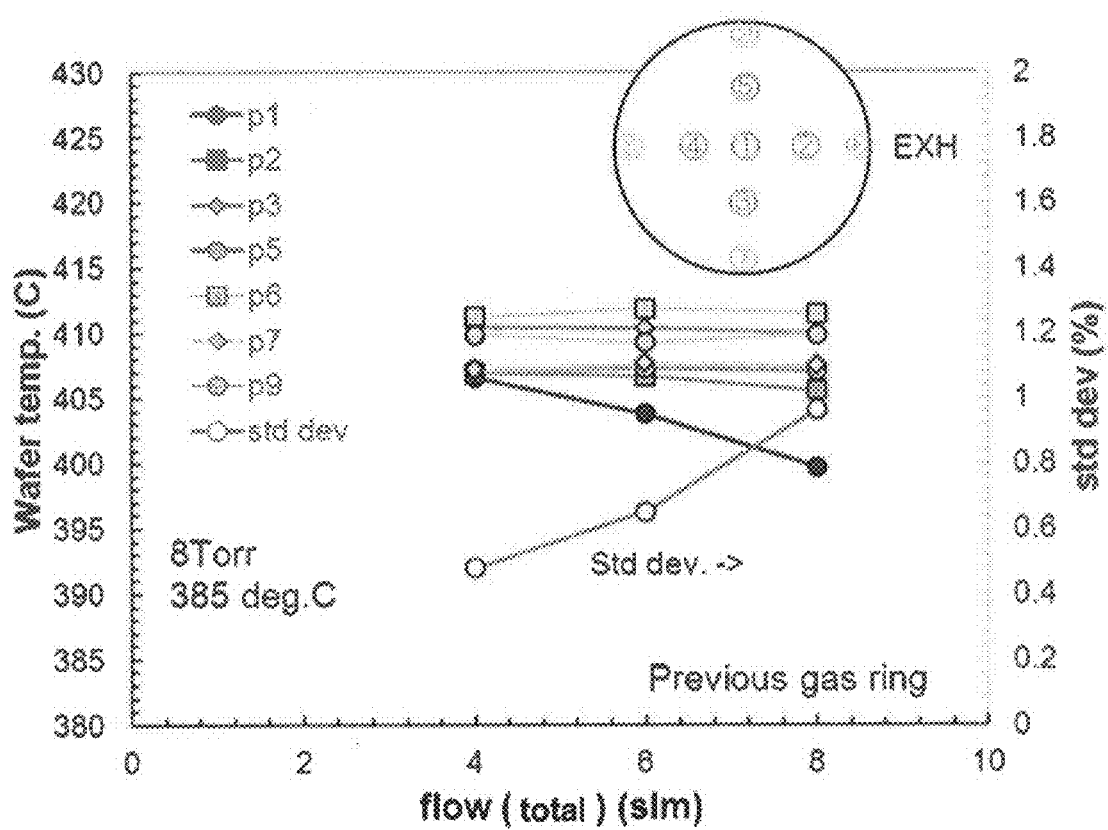
FIG. 10 is a graph showing temperature distributions over a substrate when using a conventional gas supply system.

4) Thereafter, the temperature of the wafer was measured at nine points (1 to 9) as shown in the circle in FIG. 10 (the circle represents the wafer as viewed from above).

FIG. 10 is a graph showing the resultant temperature distributions over the wafer when using the conventional gas supply system. As can be seen from FIG. 10, the temperature near the center (point No. 1) was significantly lower than that at the other points, showing convergence of the cooling gas near the center, especially when the gas flow rate was 6 slm or higher. Further, even when the gas flow rate was 4 slm, the standard deviation with respect to the temperature distribution was over 0.4%. When the flow rate was 8 slm, the standard deviation with respect to the temperature distribution become as high as about 1%.

Next, the following experiment was conducted using the apparatus illustrated in FIG. 8 with the gas supply system illustrated in FIG. 5 as an embodiment of the present invention in the same manner as above.

Figure 11:
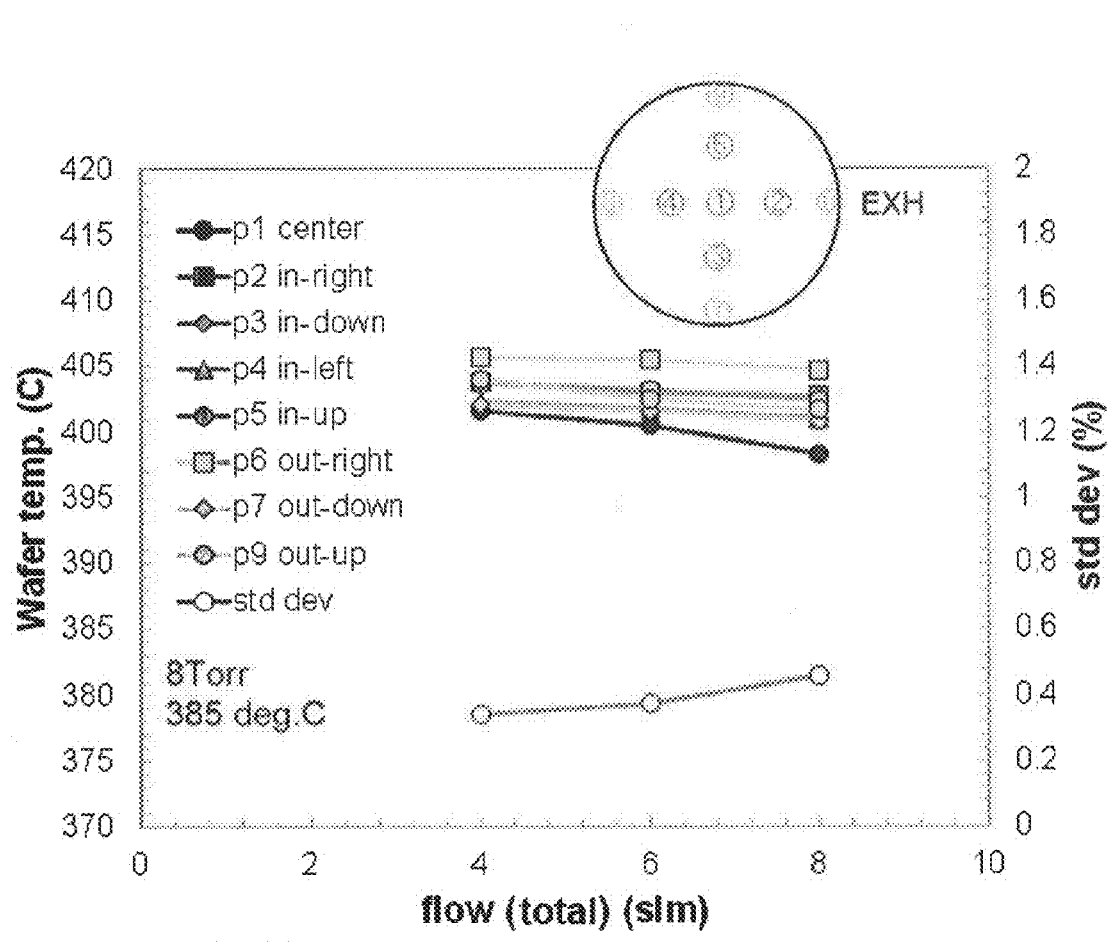
FIG. 11 is a graph showing temperature distributions over a substrate when using a gas supply system according to an embodiment of the present invention.

FIG. 11 is a graph showing the resultant temperature distributions over the wafer when using the gas supply system according of this embodiment (the overall temperatures of the wafer were lower than those in the comparative example, but it was incidental). The temperature near the center (point No. 1) was significantly close to those at the other points, showing that convergence of the cooling gas near the center was significantly alleviated, and the improvement was significant as compared with the comparative examples described above, especially when the gas flow rate was 6 slm or higher. Further, even when the gas flow rate was 4 slm, the standard deviation with respect to the temperature distribution was better than that of the comparative examples described above (lower than 0.4%). Even when the flow rate was 8 slm, the standard deviation with respect to the temperature distribution stayed as low as about 0.4%. As described above, by adding the auxiliary streams to the main stream, the temperature deviation can significantly be improved.

It will be understood by those of skill in the art that numerous and various modifications can be made without departing from the spirit of the present invention. Therefore, it should be clearly understood that the forms of the present invention are illustrative only and are not intended to limit the scope of the present invention.

We claim:

1. A method for supplying gas over a substrate in a reaction chamber wherein a substrate is placed on a pedestal, said reaction chamber having a gas-ejecting periphery on a plane, from which gas is ejected, said method comprising:
   supplying a first gas from the gas-ejecting periphery from a first side of the reaction chamber to a second side of the reaction chamber opposite to the first side in a horizontal direction passing through an axis of the reaction chamber so that the first gas travels over the substrate in a main stream from a first side of the substrate to a second side of the substrate opposite to the first side in a horizontal direction passing across a center of the substrate; and
   supplying a second gas from the gas-ejecting periphery from sides of the reaction chamber other than the first side of the reaction chamber toward the main stream, wherein the first gas and the second gas are the same gas which is ejected in three or more directions, unevenly with respect to the gas-ejecting periphery, so that the second gas travels over the substrate in auxiliary streams from sides of the substrate other than the first side in a downstream direction of the main stream, said main stream being predominant relative to said auxiliary streams.

2. The method according to claim 1, wherein gas flow in total at the second side of the substrate is greater than gas flow in total at the first side of the substrate, and the gas flow has a flow rate gradient along the main stream.

3. The method according to claim 1, wherein the second gas is supplied from the sides, toward the center of the substrate.

4. The method according to claim 3, wherein the first and second gases are discharged from the reaction chamber through a circular duct arranged around the outer periphery of the pedestal.

5. The method according to claim 1, wherein the second gas is supplied from the sides, toward an axis passing the first and second sides of the substrate.

6. The method according to claim 5, wherein the first and second gases are discharged from the reaction chamber through a duct disposed in a vicinity of the second side of the reaction chamber.

7. The method according to claim 1, wherein the first and second gases are supplied from gas nozzles circularly arranged above and around the outer periphery of the pedestal and directed to the center of the substrate, wherein first gas nozzles supplying the first gas are disposed at the first side of the reaction chamber, and second gas nozzles supplying the second gas are disposed at the sides other than the first side of the reaction chamber.

8. The method according to claim 7, wherein the first gas nozzles have higher conductance than do the second gas nozzles.

9. The method according to claim 8, wherein the first gas nozzles are disposed at shorter intervals, have a larger diameter, and/or have a shorter nozzle length as compared with those of the second gas nozzles.

10. The method according to claim 7, wherein no gas nozzles are disposed at the second side of the reaction chamber.

11. The method according to claim 7, wherein the conductance of the first gas nozzles is about 1.5 to about 10 times higher than that of the second gas nozzles.

12. The method according to claim 7, wherein an exhaust port is disposed at the second side of the reaction chamber.

13. The method according to claim 7, wherein the first gas and the second gas are the same gas and supplied through the first and second gas nozzles via a common gas channel circularly disposed above and around the outer periphery of the pedestal.

14. The method according to claim 1, further comprising rotating the pedestal while supplying the first and second gases.

15. The method according to claim 1, wherein while supplying the first and second gases, the substrate is irradiated with UV light.

16. A UV irradiation apparatus comprising:
    a reaction chamber;
    a pedestal disposed inside the reaction chamber, for loading a substrate thereon;
    a UV irradiation unit disposed above the reaction chamber; and
    a circular flange disposed between the reaction chamber and the UV irradiation unit, said circular flange being provided with a UV transmission window disposed above the pedestal and gas nozzles,
    wherein the gas nozzles are provided along the circumference of the circular flange and directed to a center of a substrate when loaded and comprise first gas nozzles for supplying a first gas disposed at a first side of the flange and second gas nozzles for supplying a second gas disposed at sides other than the first side of the flange so that the first gas travels over the substrate in a main stream from a first side of the substrate to a second side of the substrate opposite to the first side in a horizontal direction passing across a center of the substrate, and the second gas travels over the substrate in auxiliary streams from sides of the substrate other than the first side in a downstream direction of the main stream, said main stream being predominant relative to said auxiliary streams, wherein the first gas and the second gas are the same gas which can be ejected in three or more directions, unevenly with respect to the circumference of the flange, to form the main stream and the auxiliary streams, wherein the first gas nozzles have higher conductance than do the second gas nozzles.

17. The UV irradiation apparatus according to claim 16, wherein the first gas nozzles are disposed at shorter intervals, have a larger diameter, and/or have a shorter nozzle length as compared with those of the second gas nozzles.

18. The UV irradiation apparatus according to claim 16, wherein no gas nozzles are disposed at the second side of the reaction chamber, and an exhaust port is disposed at the second side of the reaction chamber.

19. The UV irradiation apparatus according to claim 16, wherein the conductance of the first gas nozzles is about 1.5 to about 10 times higher than that of the second gas nozzles.

20. The UV irradiation apparatus according to claim 16, wherein the pedestal is rotatable.

* * * * *